United States Patent
Hawkins et al.

(10) Patent No.: US 7,830,134 B2
(45) Date of Patent: Nov. 9, 2010

(54) POWER METER WITH MEANS TO ELIMINATE THE NEED TO ZERO AND CALIBRATING

(75) Inventors: Richard R. Hawkins, Santa Rosa, CA (US); Jon R. Sigler, Santa Rosa, CA (US)

(73) Assignee: Ladybug Technologies LLC, Santa Rosa, CA (US)

( * ) Notice: Subject to any disclaimer, the term of this patent is extended or adjusted under 35 U.S.C. 154(b) by 0 days.

(21) Appl. No.: 11/869,594

(22) Filed: Oct. 9, 2007

(65) Prior Publication Data

US 2008/0084199 A1 Apr. 10, 2008

Related U.S. Application Data

(60) Provisional application No. 60/828,587, filed on Oct. 6, 2006.

(51) Int. Cl.
*G01R 1/02* (2006.01)
(52) U.S. Cl. ............................ 324/130; 324/74; 324/685
(58) Field of Classification Search ................. 324/105, 324/130, 685
See application file for complete search history.

(56) References Cited

U.S. PATENT DOCUMENTS

| | | | | |
|---|---|---|---|---|
| 5,111,202 A | * | 5/1992 | Rivera et al. ................. | 341/139 |
| 5,367,533 A | * | 11/1994 | Schilling .................... | 370/342 |
| 5,373,237 A | * | 12/1994 | Imperato ................... | 324/99 D |
| 5,471,173 A | * | 11/1995 | Moore et al. ................ | 330/256 |
| 5,533,383 A | * | 7/1996 | Greene et al. ............ | 73/40.5 A |
| 5,539,304 A | * | 7/1996 | Payne et al. ................... | 324/74 |
| 5,663,638 A | * | 9/1997 | Humpherys .................. | 324/95 |
| 6,522,123 B2 | * | 2/2003 | Ribes .......................... | 324/126 |
| 6,559,631 B1 | * | 5/2003 | Balch et al. ................. | 324/142 |
| 6,944,121 B1 | * | 9/2005 | Weste et al. ................. | 370/208 |
| 6,972,622 B2 | * | 12/2005 | Jackson et al. .............. | 330/151 |
| 7,061,855 B2 | * | 6/2006 | Weste et al. ................. | 370/208 |
| 7,250,747 B1 | * | 7/2007 | Ammar .................... | 324/76.14 |
| 2004/0183550 A1 | * | 9/2004 | Fehrenbach et al. ......... | 324/662 |

* cited by examiner

*Primary Examiner*—Ha Tran T Nguyen
*Assistant Examiner*—Richard Isla Rodas
(74) *Attorney, Agent, or Firm*—Craig M. Stainbrook; Stainbrook & Stainbrook, LLP

(57) ABSTRACT

An improved power sensor having an input connector connected to an input port having a center pin and a ground side; an amplifier; first and second detectors; and a thermal stabilization system, including a thermal mass disposed between the ground side of the input connection and the detectors, a ground plane for holding the temperature of thermally sensitive components constant to within 2 degrees C., and a thermal impedance disposed between the center pin of the input port, preferably including a splitter and at least one DC capacitor, and a temperature sensor disposed on the ground plane.

1 Claim, 2 Drawing Sheets

| PdBm | Vlog | PmW | Vlin | Ratio |
|---|---|---|---|---|
| | | | | |

Vmin 0
Vmax 1
Pmin -70
Pmax -20

| PdBm | Vlog | PmW | Vlin | Ratio |
|---|---|---|---|---|
| -20 | 1.000000 | 0.01000000 | 1 | 1.00 |
| -25 | 0.900000 | 0.00316228 | 0.316221 | 2.85 |
| -30 | 0.800000 | 0.00100000 | 0.099991 | 8.00 |
| -35 | 0.700000 | 0.00031623 | 0.031613 | 22.14 |
| -40 | 0.600000 | 0.00010000 | 0.009990 | 60.06 |
| -45 | 0.500000 | 0.00003162 | 0.003152 | 158.61 |
| -50 | 0.400000 | 0.00001000 | 0.000990 | 404.04 |
| -55 | 0.300000 | 0.00000316 | 0.000306 | 979.65 |
| -60 | 0.200000 | 0.00000100 | 0.000090 | 2222.20 |
| -65 | 0.100000 | 0.00000032 | 0.000022 | 4624.71 |
| -70 | 0.000000 | 0.00000010 | 0.000000 | |

POWER METER WITH MEANS TO ELIMINATE THE NEED TO ZERO AND CALIBRATING

CROSS REFERENCES TO RELATED APPLICATIONS

The present application claims the benefit of U.S. Provisional Patent Application Ser. No. 60/828,587, Oct. 6, 2006, (Oct. 6, 2006).

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to power meters, and more specifically to means to ensure power meter accuracy, and still more particularly to a method and apparatus that eliminates the need to calibrate or zero a power meter.

2. Discussion of Related Art Including Information Disclosed under 37 CFR §§1.97, 1.98

For over 50 years all RF and microwave power meters have provided a means to zero and calibrate the meter before use. For bench use, the need to zero and calibrate is a source of inconvenience and irritation. It can also be a source of error. This requirement to zero and calibrate a power sensor becomes more problematic in large systems. In racked systems the need to zero and calibrate contributes uncertainty, adds hardware and engineering, and increases software complexity and cost.

The use model typical for power meters and sensors is: (1) remove the power sensor from all RF and microwave power sources; (2) zero the meter; (3) if required, connect the power sensor to a calibrated source; (4) if required, calibrate the power sensor; and (5) remove the power sensor from the calibrator. After taking these measures, the power meter is purportedly ready for use, and it is connected to a measurement port.

Some newer sensors introduced internal switches allowing an internal (to the sensor) load and reference to be switched in or out for purposes of zeroing and calibration. And while this approach mitigates some problems it causes others. The problems mitigated are the need for the user to make/break electrical connections during calibration and zeroing. However, its very nature introduces additional expense. These switches introduce additional uncertainty. In addition, the process of switching induces discontinuities in the signal paths. These discontinuities can be the source of unwanted reflections especially in systems with sensitive receivers.

Calibration before use should not be confused with annual calibration. Calibration before use (if required) is accomplished by connecting the power sensor to a calibrated reference after it has been zeroed. This source is a part of the power meter. It is most commonly a 1 mW, 50 MHz source. Zeroing or calibration before use is typically recommended when ambient temperature changes by about 5° C.

To understand how zeroing and calibration affects system hardware and software design, it is useful to consider a simple example. Assume a modest automated system with a number of paths, such as the system 100 one shown in FIG. 1, which includes an input (start) path 110, a number of circuit elements and devices 120, and an output (end) path 130. All measurements using these paths must be path loss compensated. Designers of automated systems want to minimize user interaction and test execution time.

In practical systems, path loss requires periodic measurement. Path loss is generally determined by taking the difference between two measurements. This implies that one measurement must be taken at points proximate each end of the path, and these points must be accessible to the measurement device. The low cost and relative accuracy of power meters make them a good choice for path loss measurements.

However, entirely automated path loss measurement presents complications, many of which are related to the need to zero and calibrate the power meter/sensor.

The following sets out a path loss calibration algorithm which requires some user interventions and is not concerned with minimizing user interaction or speeding up overall measurements:

User removes sensor from all system connections
User zeros the sensor
If calibration is required
    User connects sensor to reference
    Calibrates the sensor
End if
User connects sensor to input measurement point
For each frequency
    Make measurement
Next Frequency
User connects sensor to the output measurement point
For each frequency
    Make measurement
Next Frequency
For each frequency
    Apply difference between input and output to path correction
    Apply systematic or known offsets to path correction
Next Frequency In newer sensors with internal switches, the points requiring the user to remove and/or connect the sensor in the process outlined above would be replaced with commanding the sensor to switch in the load or reference as needed. Clearly this is an advantage in terms of speed and allows the system to be more automated. However, there is a clear trade off in terms of additional expense and the discontinuity issues and changes in system match are still present.

This is a simplified path calibration process showing all user interventions in bold typeface. What is not noted is the need for the user to pay close attention to the proximity and routing of signals and the placement of the power meter and sensor in the system. This will be dealt with later in this disclosure.

A completely automated process is far more desirable. However, because power meters require zeroing and/or calibration, complete automation is more expensive and more difficult to achieve. The inventive automated method and apparatus does not depart substantially from the user-mediated process outlined above. However, the design of the inventive system is modified such that the system breaks the sensor connection to the system and then makes the connections to the sensor reference, and input and output measurement points. These connections are managed through switches.

Consider the first user interaction from the sequence outlined above: User removes sensor from all system connections: For presently available sensitive sensors (sensitivities below −65 dBm) the sensor is often connected to a port that guarantees signal levels lower that −80 dBm. This can be done by connecting the power sensor to a port terminated into a 50Ω load. This sometimes requires the addition of a microwave switch. This switch must be managed by software and the additional uncertainty and correction must be accounted for in the measurement.

What is generally not recognized is the need to keep track of the last zero and calibration in the system software. On complex systems this must be done across many tests and measurements. The alternative to doing this is to zero and calibrate before each major test. This causes extra wear on switches and can be significant in some case and costs extra measurement time since zeroing and calibration (in relative terms) a time-consuming measurement.

The next user interaction is even more problematic: User connects sensor to reference. The power meter sensor is specified based on the assumption that during calibration the sensor is connected directly to the calibration source. Some manufacturers recognize the significance of this problem and have included references internal to the sensors. It should be clear that the calibration reference must be routed to every sensor or every measurement point must be routed to a single sensor. As a result there will be more switches, greater uncertainty and greater cost.

There is one other, perhaps more subtle, problem associated with calibration: The existence of the calibrator and the need to make it extremely accurate forces the manufacturer of the power meter to fix the connector type and sex. This decision is not without negative impact on the system.

By fixing the type and sex of the connector of the calibrator, the manufacturer also fixes the type and sex of the power sensor. This almost always forces the system designer to employ adapters between the system and the power meter. Every adaptor adds further uncertainty to the measurements of the system. This small initial uncertainty may have an unexpectedly larger impact because it is seen in subsequent uncertainty calculations.

The next user interaction is: User connects sensor to input measurement point. Again, this intervention poses additional problems. In most RF and microwave systems the measurement should be as close as possible to the components being measured. In this case the paths are likely buried inside a complex system (path routing accomplished with a switch matrix). The paths within the system are generally not accessible. The only alternative in most systems is to bring the measurement port out to the power sensor.

This can add significant path length to signals that may not be able to tolerate the associated loss or mismatch. This poses serious problems for system developers. The result is often serious compromises in accuracy test time and it adds complexity and hardware costs.

As a practical matter the relationship of zeroing and calibration to temperature can be shown to be almost exclusively associated with the sensor (or detector) itself. In other words, the meters have traditionally had little impact on zero and calibration drift issues. This can be demonstrated using the venerable Agilent Technologies, Inc HP432A and HP478A in their normal configurations. Experiments show that an HP478A (connected to an HP432A) in a normal environment will require coarse and fine zeroing after being turned on.

During roughly the first half hour after it has been turned on, the HP478A will need to have this process repeated about every 4-5 minutes. It may require zeroing more often if the most sensitive ranges are used. As the device stabilizes it still requires a zeroing and calibration every half hour, and more often if the environment is less well controlled.

In addition, zero and calibration will be required more frequently if the device is handled. Simply picking up a newly zeroed device will cause significant drift of the zero on the lower ranges. This same routine can be repeated with other sensors and RF detectors.

On the other hand, if the HP478A power sensor is placed in a temperature controlled environment, it can remain zeroed indefinitely. Experiments show that an HP478A that is heater stabilized temperature to within ±½° C. will remain zeroed indefinitely. In experiments conducted by the present inventors, however, only the HP478A was temperature stabilized; the HP432A power meter was not temperature stabilized. During this time ambient temperature ranged from about 50 F to more than 80 F.

Accordingly, despite the fact that awareness of the problem and its source has existed for more than fifty years, power meters have remained fundamentally unchanged.

The foregoing systems reflect the current state of the art of which the present inventors are aware. Reference to, and discussion of, these systems is intended to aid in discharging Applicants' acknowledged duties of candor in disclosing information that may be relevant to the examination of claims to the present invention. However, it is respectfully submitted that none of the prior art methods or devices disclose, teach, suggest, show, or otherwise render obvious, either singly or when considered in combination, the invention described and claimed herein.

BRIEF SUMMARY OF THE INVENTION

The present invention comprises a method and apparatus that eliminates the need to calibrate or zero a power meter. Because variation in physical properties is great, it is difficult to apply a quantitative approach to this solution. Fortunately, experience indicates that minimal experimentation results in excellent results in short order.

The present invention combines techniques that were present on the first power meters (in the 1950s) but adds novel elements and method steps. The inventive elements include: (1) adding thermal isolation between the detector at the measurement port; (2) measuring detector temperature directly or as directly as possible (some designs measure the temperature of the "sensor"); (3) adding gain in low signal level paths, using (a) linear amplifier, and (b) a log detector.

In this context log detector generally comprises a detector followed by a logging amplifier. In general gain may be present before the detector as part of the detector or between the detector and the logging amplifier. The preferred embodiment uses an integrated device employing the progressive compression technique over a cascaded amplifier chain. However, any function may be used in place of the log detector (function) provided range compatibility, monotenicity and adequate power resolution is achieved. When operated outside of its square law range, the Agilent E4412A Wide Dynamic Range CW Power Sensor is example of such a function; however, it can only measure CW (discussed below) and does not address key aspects of this invention. The preferred embodiment uses the AD8318 manufactured by Analog Devices Inc.

Historically, log detectors have not been used in RF and microwave power measurement instrumentation for purposes of measuring accurate power. The primary reason for this has to do with the fact that, up until recently, RF power has been made with detectors providing a voltage proportional to power. The primary reason for this was the fact that measurement integration, to support pulse and other non-CW (Continuous Wave signal operating at a fixed unmodulated frequency), had to be done in hardware. And correct integration requires each of the signal components to be proportional to power.

Another important aspect of the log detector has to do with the management of signal bandwidths; there are three places to set the bandwidth. Setting them correctly is imperative to measure power correctly. Bandwidth will be discussed later. At the outset, however, there is first a discussion on integration using the diode topology similar to that employed in the Agilent E4412A.

Power measurements have been made using detector diodes operating in their square law region, or that region of the detection curve where detected voltage is proportional to RF input power. As power is increased the detected output of the diode begins to compress and output accuracy suffers considerably. In recent years, the application of computing power allows a technique often referred to as compression correction. Compression correction works well provided the sensor is measuring CW power (power concentrated at a Continuous Wave signal operating at a fixed unmodulated frequency). This technique has been employed in commercial power sensors like the Agilent E4412A Wide Dynamic Range Power CW Power sensor. The problem is the technique is limited to CW signals.

When measurement of complex signals, such as pulsed RF found radar or many of the CDMA, W-CDMA, WiMAX, AM, FM, etc. signals found in wireless and hard-line communications today, signals cannot be measured correctly when applying compression correction. This is because in order to correctly measure the RF power the total of all power components within the signal bandwidth must be integrated or added together. A diode detector operating in square law does the integration in hardware using the integrating capacitor following the detector. The integration capacitor sets the video bandwidth of the detector and all frequency components outside the video bandwidth are integrated by the integrating capacitor. Off course all signals inside the video bandwidth pass through.

When the detector is in square law, the components are proportional to power and the integrated components are proportional to power. Thus both CW and complex signals maintain the same relationship between measured and actual power.

When the detector is outside of square law, the components are no longer proportional to power and thus when integrated the result is not propositional to power. In fact each complex signal format generally results in a different integrated value for a given power level. Thus both CW and complex signals do not maintain the same relationship between measured and actual power outside of square law.

A log detector suffers from the same integration relationship problem as with the diode detector operating in compression just described. However, by applying filters at the correct points in the measurement chain and making sure correct power integration occurs, a log detector (and diodes in compression, etc) can be used and CW as well as the various complex signal formats may be correctly measured using the same linear integration relationship.

The invention has three filters. (1) A detector filter, the filter associated with the detector. Usually set by the integrating capacitor following the detector. This capacitor integrates linear power measured at the detector when the detector is operating in its square law region. (2) The bandwidth of the logging amplifier (or other non-linear monotonic stage or component). The capacitance (or equivalent capacitance) determines the bandwidth of this stage. This capacitor will linearly integrate whatever signal appears outside its bandwidth. And like the diode operating in compression, correct power integration for signals outside the logging amplifier's bandwidth cannot occur in this filter. (3) The bandwidth of the ADC (analog-to-digital converter). The capacitance (or equivalent capacitance) of the ADC sets the acquisition bandwidth. Because the ADC is receiving the logging amplifier signal, which cannot be integrated correctly, digitized signals are inherently nonlinear. Thus correct power integration cannot occur for signals falling outside the ADC's filter bandwidth.

With this in mind, for a practical implementation designed to measure power for both CW and complex signals, there are two ways to properly manage the filters (1) Unlimited video bandwidth approach practical video bandwidth limit for measuring microwave power is on the order of hundreds of MHz; as frequency increases so will the bandwidth). (2) Limited video bandwidth approach, such as implemented in the preferred embodiment.

In the unlimited video bandwidth approach, bandwidth is set by the detector bandwidth, which correctly integrates power at the point of detection. The detector must provide a signal proportional to power. Power cannot be integrated by the logging amplifier and therefore the logging amplifier's bandwidth must be greater than the detector bandwidth. In this case CW and complex average power measurements for very wideband signals can be made. For signals falling inside the detector bandwidth, appropriate data acquisition techniques and DSP techniques must be applied. The DSP is similar to the DSP used for the limited video bandwidth case to be described below. The detector bandwidth also sets the video bandwidth for time domain or pulse profiling as well as the bandwidth whereby a variety of DSP functions (histograms, etc.) can be employed.

In the limited bandwidth case, bandwidth is made as wide as possible and is therefore typically set by the logging amplifier bandwidth or the ADC bandwidth. In either case power integration can occur on a logged signal (either the logging amplifier or the ADC). Thus, only accurate power measurements can be made for signals falling within the smaller of the logging amplifier or ADC bandwidth. In the preferred embodiment, the logging amplifier bandwidth is set to approximately 20 MHz and the ADC bandwidth is set to 10 MHz. Thus the preferred embodiment is limited to correctly measuring signal in a 10 MHz bandwidth. The detector's large signal bandwidth exceeds 50 MHz and its small signal bandwidth exceeds 500 MHz. In this case signals falling within the 10 MHz pass through the video bandwidth of the system and are digitized and of course these digitized samples are correctly measured. To get an accurate representation, as with any DSP acquisition system, many samples must be made.

The result is a series of samples varying with time and as a function of the signal being measured. To determine the correct measured power the key is to correctly convert the series of samples into a correct power measurement. Because the samples pass through the non-linear logging amplifier simple integration cannot produce the correct power measurement. Integration can only be correctly applied to the corrected linear power samples. Thus appropriate DSP consists of applying power correction to the samples and then integrate.

Of course integration is done on samples converted to their linear in watts (or milliwatts, etc.) form.

If a time domain or pulse profile plot or other signal processing is desired, the samples can be used after correction is applied.

The present invention also employs design elements and techniques present in older designs. The primary element used in almost all past designs includes use of relatively large thermal mass. Other techniques have been used in other sensors to mitigate the impact of thermal changes on measurements. This includes the characterization, measurement and compensation of ambient temperature or other the overall temperature of the sensor.

It is important to note that measuring ambient temperature or sensor temperature may help mitigate the issue of zero drift. It is insufficient by itself. This is largely due to uncontrolled thermal gradients that are allowed to exist between the point of temperature measurement and the detector. This means that at low levels the detected power will follow local temperature changes more closely than changes in power level.

This fact is evident from experiments using the HP432A and HP478A. Add to these facts that even when the HP478A is used in carefully controlled ambient environments (free air but well controlled) the HP478A still has significant short term and sometime long term zero drift problems.

The experiments also show that when the entire HP478A is entirely enclosed in a highly controlled environment both short term and long term zero drift was eliminated. This same sort of drift is present in detectors.

Management, measurement (and compensation), and mitigation of the effects of temperature is key. All this is consistent with general metrology knowledge. It is also important to recognize the primary types of temperature instability that force zeroing include: (1) short term instabilities (a second or less to several seconds); and (2) longer term instabilities (more than several seconds).

Short term instabilities are caused by a number of factors. Handling, changes in the temperature of connections, rapid changes in ambient temperature, the movement of exhaust air from other equipment over the sensor body and so on. These short term changes tend to affect the most sensitive power measurements or ranges.

Long term stabilities tend be associated with the warm-up (power dissipation of the unit itself), ambient temperature changes, and connection to very cold or very warm connector. These changes tend to affect all ranges and power levels.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of the claims appended hereto.

Accordingly, before explaining the preferred embodiment of the disclosure in detail, it is to be understood that the disclosure is not limited in its application to the details of the construction and the arrangements set forth in the following description or illustrated in the drawings. The inventive apparatus described herein is capable of other embodiments and of being practiced and carried out in various ways.

Also, it is to be understood that the terminology and phraseology employed herein are for descriptive purposes only, and not limitation. Where specific dimensional and material specifications have been included or omitted from the specification or the claims, or both, it is to be understood that the same are not to be incorporated into the appended claims.

As such, those skilled in the art will appreciate that the conception, upon which this disclosure is based may readily be used as a basis for designing other structures, methods, and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and structures that characterize the invention, are pointed out with particularity in the claims annexed to and forming a part of this disclosure. For a better understanding of the present invention, its advantages and the specific objects attained by its uses, reference should be made to the accompanying drawings and descriptive matter in which there are illustrated the preferred embodiment.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 3:
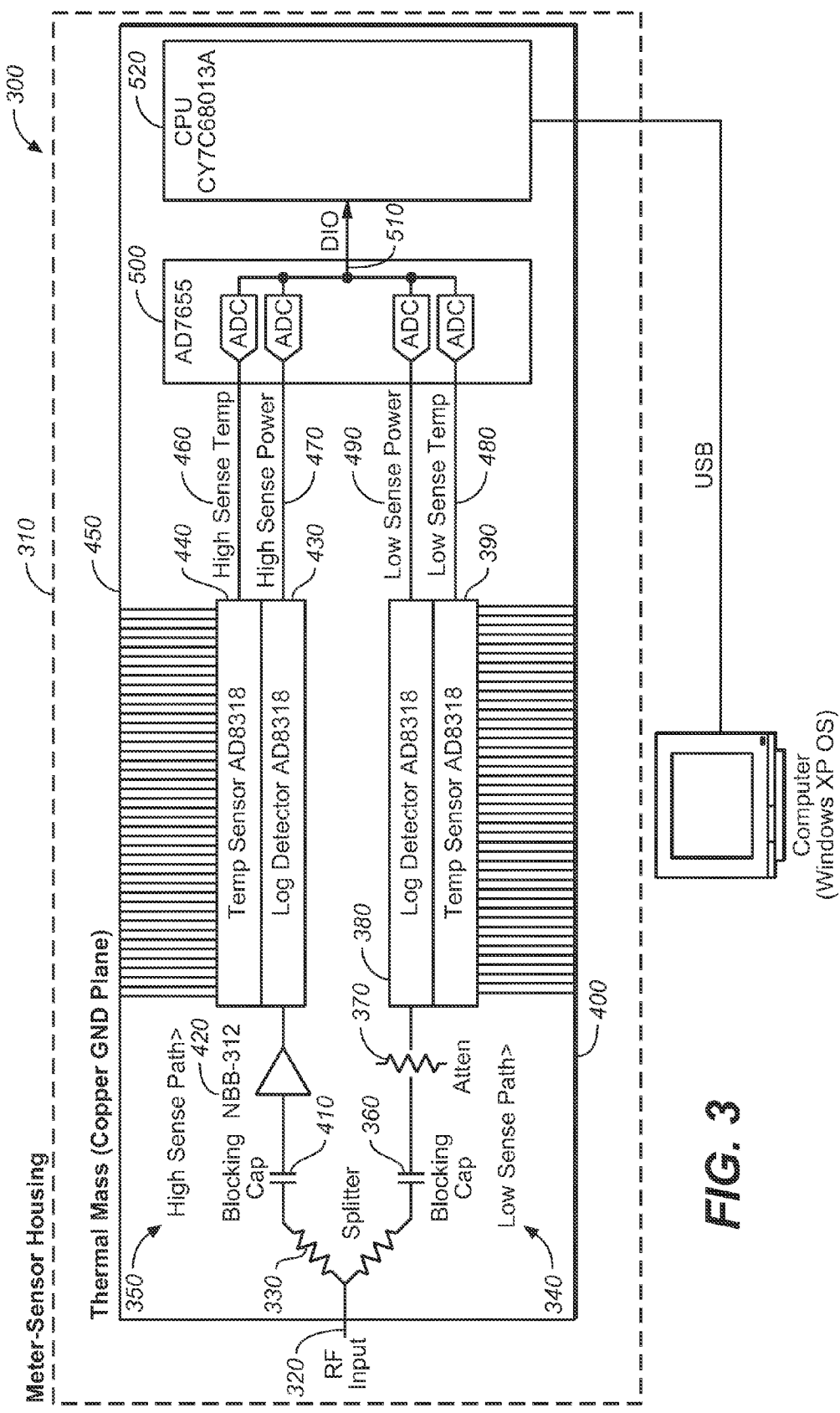
FIG. 3 is a schematic view showing the principal elements comprising the power sensor of the present invention.

Referring now to FIG. 3, the first step in providing the improved power meter of the present invention is to isolate the incoming signal detector from the measurement port. Specifically, there is a need to ensure that any thermal transient that appears on the center conductor of the input port is not allowed to propagate to the detector. Capable engineers frequently design sensors for maximum sensitivity. Doing this requires the sensor be connected to the incoming signal with as little loss as possible. This also means the detectors are directly accessible to those same temperature changes.

The inventive design preferably includes at least one low loss attenuator or power splitter disposed between the incoming signal and the detector. As the number of thermal impediments between the incoming signal and the detector are increased, short term sensitivity is improved.

The next step is to add temperature monitoring to the detectors or to completely stabilize the detector temperature, preferably the former. There are three basic ways to do measure temperature of the detector: (1) by using an RF detector with temperature monitoring (such as an the AD8318 by Analog Devices used in the preferred embodiment); or (2) by using a detector die with a pair of detectors, wherein one detector is used for temperature measurement; or (3) by using a detector in close proximity and low thermal impedance to a temperature measuring device.

Accurate temperature readings are not critical, but repeatability and sensitivity are. One must be able to detect changes as small as 0.5° C. Circuit designs meeting these criteria are numerous.

The second step is to minimize the rate of change of thermal effects. This serves to reduce the rate of change of the thermal gradients between temperature sensitive elements critical to measurement. It is important the thermal gradient be stable enough to hold the temperature of detectors, amplifiers, and other devices constant; specifically to hold their temperature to within a constant 1-2 degrees with respect to a thermally stabilizing mass.

For example, if the temperature sensitive elements in the sensor are an amplifier and a detector, the temperature gradient between these elements and some ambient temperature should be measured. In other words, the largest temperature difference should be found. Then ambient temperature should be changed and the temperature gradient re-measured. The length of time it takes to stabilize should be noted, and it will be clear that the new gradient is about the same as the old gradient and the temperature of the devices is constant with respect to each other and a thermally stabilizing mass.

Having done this, the performance of all the thermally sensitive elements are coordinated and compensated. Experiments show that if this is done properly, if one point on this thermal plain can be compensated, then all points can be compensated.

Finally, a method is employed to test the repeatability of the sensor for given temperatures. This is commonly done in the industry. It is most easily done by placing the sensor in a temperature controlled environment and measuring the indicated power relative to temperature over the temperature range and power range of interest. If this results in repeatable measurements, then the long term temperature changes are now manageable.

In most instances it is insufficient to measure temperature only. Cross-referencing temperature and power may be necessary.

Next, a correction table is developed and employed to cross reference the correction of power readings for a range of temperature. These tables, like many temperature correction tables can be stored in ROM with the sensor. This mitigates the long term temperature issues and many of the short term changes. The effects of temperature on the lowest level signals may still be evident.

The last step deals with very small, fast changes in temperature. Those with skill in the art understand that this area concerns the last 10-15 dB of sensitivity. The problem is easily understood when one considers that short term variation in the diode junction voltage is nearly the same as the changes in detected voltage. Two options are possible: (1) control the variation (e.g. by using an oven sufficiently large mass, with a low thermal impedance to the detector); (2) avoid using this portion of the diode range.

Either approach may be used, but it is preferable to avoid using this portion of the dynamic range of the diode. This is most easily accomplished by amplifying the signal prior to detection. The preferred embodiment uses the AD8318, which is a log detector employing the progressive compression technique over a cascaded amplifier chain. The preferred embodiment also contains a preamplifier at the RF input.

The value of the log detector over a linear detector is readily evident. The log detector supplies a voltage proportional to the log of power. Also, most log detectors also supply some gain. The linear detector supplies a signal that is proportional to the power. While this is widely understood in the industry a brief demonstration is appropriate.

To demonstrate the advantage, assume a linear detector and log detector operate output the voltage range (say 0.0 volts to 1.0 volt) but their outputs are scaled according to their respective functions (linear and log). Furthermore, assume both operate over −70 to −20 dBm. Ignoring the non-linear nature of these diodes for simplicity: (1) for the linear diode, a −70 dBm to −65 dBm change in power results in change in output voltage of about 0.3 µV; (2) for the log detector, a −70 dBm to −65 dBm change in power results in change in output voltage of about 0.1 v.

This difference represents a 4000:1 ratio at low levels. Clearly there is a tradeoff to be made. Using a log detector in a power sensor has been viewed as problematic. As discussed above the modulated video output of a log detector cannot be directly averaged (integrated) using filters. This is readily remedied by converting the digitized log output from dBm to mW then averaging digitally as already described. This goes a long way in managing short term temperature changes.

Figures 1, 2:
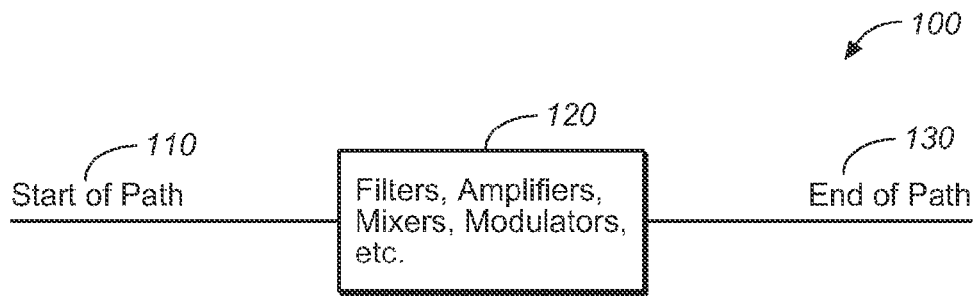
FIG. 1 is a schematic showing a typical system 100 in which path loss would be expected.
FIG. 2 is a table 200 comparing voltage changes within a −20 dBm to −70 dBm range as detected by a linear detector versus a log detector.

The next step is to add an amplifier for low level measurements. While some noise figure is sacrificed, additional immunity to thermal noise variation is addressed. As an illustration, consider the table 200 shown in FIG. 2. In this table, the change in voltage (for the linear detector) between −70 and −60 dBm is about 0.09 mV. The change in voltage between −60 and −50 dBm for the same detector is about 0.9 mV. Assuming that PN junction voltage changes of a few millivolts per degree C., it is easy to see that this additional gain will provide some additional immunity to short term, low level temperature variation.

Still referring to FIG. 3, according to the foregoing method steps, there is provided a novel power meter/temperature sensor of the present invention 300, which comprises a housing 310 having a connector for an analog RF input signal 320, which is split by a splitter 330 into a lower sense path 340 and a high sense path 350. The signal in the low sense path is fed through a blocking capacitor 360 and then an attenuator 370 before being fed into a log detector 380 and temperature sensor 390 having a thermal mass disposed on the ground plane 400. The high sense path is likewise fed through a blocking capacitor 410 and then an amplifier 420, such as an NBB-312, produced and sold by RF Micro Devices, Inc. of Greensboro, N.C., which is a cascadable broadband gallium arsenide (GaAs) monolithic microwave integrated circuit (MMIC) amplifier. That signal then passes on to a log detector 430 and temperature sensor 440 having a thermal mass 450 disposed on the ground plane.

The analog outputs 460, 470, 480, and 490 from the detectors and sensors are fed into an analog to digital converter 500, such as an AD7655, produced and sold by Analog Devices of Norwood, Mass., which is a low power four-channel, 16-bit analog/digital converter with a 0-5V voltage range for the analog input and uses a single 5V power supply. The digital output 510 is sent to a microcontroller 520, which in a preferred embodiment is a Cypress CY7C68013A, by Cypress Semiconductor Corporation of San Jose, Calif. The CY7C68013A is a low-power USB 2.0 microcontroller that integrates a USB 2.0 transceiver, serial interface engine, enhanced 8051 microcontroller, and a programmable peripheral interface in a single chip. The CPU is programmed to acquire the digitized samples and transfer them to a computing platform, which preferably operates Windows XP, but which may utilize any of a number of suitable operating systems currently in use in the industry. A set of software programs residing on the computing platform perform the above-described DSP computations—scaling, averaging (integration), compensating, temperature change detection and time determinations, and correction table cross referencing to correct power readings for a range of temperatures. (of course the DSP functions could in general reside in either the Windows XP computing platform or equivalent or in an impeded controller operating in the device.)

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A power meter and temperature sensor, comprising:
   a housing having an input connector for receiving an analog RF input signal
   a splitter for splitting said RF input signal into a low sense path and a high sense path;
   a first blocking capacitor and an attenuator, each disposed on said low sense path;
   a first log detector and temperature sensor succeeding said first blocking capacitor and said attenuator and having a thermal mass disposed on a common ground plane, and first log detector and temperature sensor having analog outputs;
   a second blocking capacitor and an amplifier disposed on said high sense path;
   a second log detector and temperature sensor succeeding said second block capacitor and said amplifier and having a thermal mass disposed on a common ground plane, said second log detector and temperature sensor having analog outputs, said second log detector and temperature sensor having the same dynamic range as said first log detector;
   an analog/digital converter for receiving the analog outputs from said first and second log detectors and temperature sensors; and
   a microcontroller for receiving the digital output from said analog-to-digital converter, said microcontroller including digital signal processing algorithms for applying temperature compensating power correction and digital integration to said digitized data and producing corrected power measurements.

* * * * *